(12) United States Patent
Gasse et al.

(10) Patent No.: US 11,165,005 B2
(45) Date of Patent: Nov. 2, 2021

(54) METHOD FOR PRODUCING A MICROELECTRONIC CHIP TO BE HYBRIDISED TO A SECOND CHIP

(71) Applicant: COMMISSARIAT A L'ENERGIE ATOMIQUE ET AUX ENERGIES ALTERNATIVES, Paris (FR)

(72) Inventors: Adrien Gasse, Seyssins (FR); David Henry, Gieres (FR); Bertrand Chambion, Pontcharra (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 58 days.

(21) Appl. No.: 16/342,446

(22) PCT Filed: Oct. 16, 2017

(86) PCT No.: PCT/FR2017/052828
§ 371 (c)(1),
(2) Date: Apr. 16, 2019

(87) PCT Pub. No.: WO2018/073517
PCT Pub. Date: Apr. 26, 2018

(65) Prior Publication Data
US 2020/0058837 A1    Feb. 20, 2020

(30) Foreign Application Priority Data

Oct. 19, 2016    (FR) ...................................... 16 60118

(51) Int. Cl.
*H01L 33/62*    (2010.01)
*H01L 31/02*    (2006.01)
(Continued)

(52) U.S. Cl.
CPC ............ *H01L 33/62* (2013.01); *H01L 25/167* (2013.01); *H01L 31/02005* (2013.01);
(Continued)

(58) Field of Classification Search
CPC ..... H01L 2224/13111; H01L 2924/014; H01L 2224/13109; H01L 2224/8112;
(Continued)

(56) References Cited

U.S. PATENT DOCUMENTS

2006/0278986 A1* 12/2006 Trezza .................. H01L 23/481
                                                        257/744
2007/0170574 A1* 7/2007 Lauxtermann .... H01L 21/76898
                                                        257/686
(Continued)

FOREIGN PATENT DOCUMENTS

JP    3-266478 A    11/1991
JP    5-36966 A    2/1993
(Continued)

OTHER PUBLICATIONS

International Search Report dated Mar. 8, 2018 in PCT/FR2017/052828 filed on Oct. 16, 2017.
(Continued)

*Primary Examiner* — Duy T Nguyen
(74) *Attorney, Agent, or Firm* — Oblon, McClelland, Maier & Neustadt, L.L.P.

(57) ABSTRACT

The invention relates to a method for producing a first microelectronic chip including a layer of interest having a connection face, intended to be hybridized with a second microelectronic chip. The method including depositing a layer of adhesive on a face of the layer of interest opposite to the first connection face and fastening a handle layer to the layer of adhesive. The method also includes, prior to the steps of depositing the adhesive and fastening the handle
(Continued)

layer, defining, on the one hand, a maximum thickness $e_{cc}^{max}$ and a minimum value $E_{cc}^{min}$ and a maximum value $E_{cc}^{max}$ of the Young's modulus for the layer of adhesive, and, on the other hand, the minimum thickness $e_{cp}^{min}$ for the handle layer.

14 Claims, 7 Drawing Sheets

(51) Int. Cl.
    *H01L 31/18*         (2006.01)
    *H01L 33/00*         (2010.01)
    *H01L 25/16*         (2006.01)

(52) U.S. Cl.
    CPC ........ *H01L 31/186* (2013.01); *H01L 33/0095* (2013.01); *H01L 2933/0066* (2013.01)

(58) Field of Classification Search
    CPC . H01L 2924/00014; H01L 2924/01029; H01L 2924/01047; H01L 21/6835; H01L 2221/68368; H01L 2221/68372; H01L 2224/16145; H01L 2224/81005; H01L 2224/81191; H01L 2224/81815; H01L 24/81; H01L 25/167; H01L 27/1469; H01L 2924/351; H01L 2933/0066; H01L 31/02005; H01L 31/186; H01L 33/0095; H01L 33/62

USPC .......................................................... 438/22
See application file for complete search history.

(56) References Cited

U.S. PATENT DOCUMENTS

2008/0113495 A1    5/2008   Ginn et al.
2010/0001188 A1    1/2010   Ginn et al.

FOREIGN PATENT DOCUMENTS

JP          3114759 B2    12/2000
JP          2014-7201 A    1/2014

OTHER PUBLICATIONS

"Hot curing epoxy system based on Araldite® LY 556 / Hardener HY 917 / Accelerator DY 070," Ciba Specialty Chemicals: Performance Polymers—Structural Composites—Matrix Systems for Industrial Composites, Feb. 1998, https://web.archive.org/web/20140912031603/http://www.lindberg-lund.com/files/Tekniske%20datablad/VAN-HY917-H-TD.pdf, retrieved on Jul. 10, 2017, 8 total pages, XP055389168.

* cited by examiner

METHOD FOR PRODUCING A MICROELECTRONIC CHIP TO BE HYBRIDISED TO A SECOND CHIP

TECHNICAL FIELD

The field of the invention is that of assembly, or hybridization, of two microelectronic chips with each other, comprising the application of a so-called hybridization temperature.

The invention more precisely relates to the production of a first microelectronic chip intended to be hybridized with a second microelectronic chip, and to a method for hybridizing the two microelectronic chips.

The invention is applicable to the assembly of chips made of different materials, such as for example an optoelectronic chip comprising a matrix array of light-emitting diodes or photodiodes based on GaN on a chip comprising a readout circuit based on silicon.

PRIOR ART

It is often necessary to hybridize two microelectronic chips with each other, i.e. to join them mechanically by applying a so-called hybridization temperature, while ensuring electrical and mechanical interconnection therebetween.

The microelectronic chips may equally well be electronic devices such as an integrated circuit for reading and/or processing electrical signals, as optoelectronic devices such as a matrix array of light-emitting diodes or photodiodes.

The microelectronic chips are joined via their respective connection faces, on which faces each chip comprises a matrix array of N*M electrical interconnection pads. The assembly method then comprises a step of aligning and bringing into contact the interconnection pads pairwise, then a step of applying a so-called hybridization temperature, thus forming a mechanical link between the two chips by fusion or inter-diffusion of the interconnection pads of each microelectronic chip or both microelectronic chips.

Figure 1A:
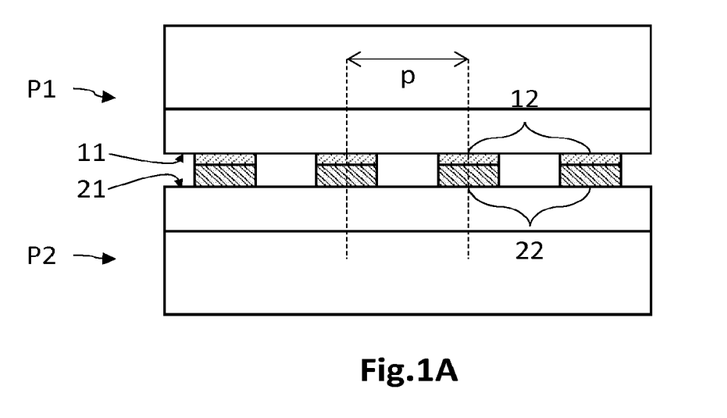
FIGS. 1A and 1B, which have already been described with reference to the prior art, are partial schematic cross-sectional views of a step in which microelectronic chips are brought into contact so that the interconnection pads are aligned pairwise (FIG. 1A), and of a step in which temperature is increased to the hybridization value $T_h$, illustrating the relative misalignment of the interconnection pads (FIG. 1B)

As schematically illustrated in FIG. 1A, the microelectronic chips P1, P2 are, initially, brought into contact with each other in such a way that the respective interconnection pads 12, 22 are aligned and superposed pairwise, and in contact. The interconnection pads 12, 22 are here spaced apart from one another periodically with a pitch p. In this example, the interconnection pads 22 of the second chip P2 comprise a meltable material, for example based on indium or another metal or alloy, such as a eutectic SnAg or SnAgCu alloy, and the interconnection pads 12 of the first chip P1 are made from a material that is wettable by the meltable material when the latter is in liquid phase.

Figure 1B:
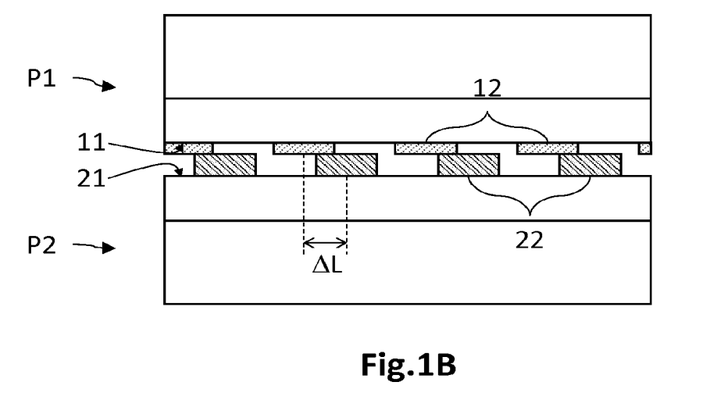

As illustrated in FIG. 1B, the chips P1, P2 are then subjected to the hybridization temperature $T_h$, which is higher than or equal to the melting point of the meltable material of the interconnection pads 22 of the second chip P2, for example higher than or equal to about 220° C. A relative misalignment $\Delta L$ of the interconnection pads 12, 22 may then appear because of the difference between the thermal expansion coefficients of the two chips P1, P2. This relative misalignment, which may be expressed by the relationship $\Delta L = L/2 \cdot \Delta\alpha \cdot \Delta T$, where L is the length or the diameter of the chips P1, P2, which may be approximated to be about N.p, where $\Delta\alpha$ is the difference in thermal expansion coefficient between the chips P1, P2 at the connection faces 11, 21, and where $\Delta T$ is the temperature difference between room temperature and the hybridization temperature.

By way of illustration, for $\Delta T$ equal to about 200° C. and $\Delta\alpha$ equal to about $4 \times 10^{-6} K^{-1}$, and for chips P1, P2 each having a matrix array of 1280×1024 interconnection pads 12, 22 spaced apart by a pitch of 50 μm, the relative misalignment $\Delta L$ may reach half the pitch p, i.e. here about 25 μm, or more. The relative misalignment may lead, notably in the case of small pitches and large interconnection matrix arrays, to a loss of mechanical contact and therefore to an electrical connection fault between the respective interconnection pads.

SUMMARY OF THE INVENTION

The objective of the invention is to at least partially remedy the drawbacks of the prior art, and more particularly to propose a method for producing a first microelectronic chip intended to be hybridized with a second microelectronic chip in such a way that, in the subsequent hybridization phase, the relative misalignment between the respective interconnection pads is smaller than a preset threshold value.

To achieve it, one subject of the invention is a method for producing a first microelectronic chip comprising a layer, called the layer of interest, having a first face, called the connection face, on which electrical interconnection pads are located, and having a thermal expansion coefficient $\alpha_{ci}$, and intended to be joined, at a temperature called the hybridization temperature $T_h$, to a second microelectronic chip having a second face, called the connection face, on which electrical interconnection pads are located, and having a thermal expansion coefficient $\tilde{\alpha}_{P2}$, called the apparent thermal expansion coefficient, at the second connection face, lower than the thermal expansion coefficient $\alpha_{ci}$.

According to the invention, the method comprises the following steps:
  depositing a layer of adhesive on a face of the layer of interest opposite to the first connection face, said layer of adhesive having a thickness $e_c$ smaller than or equal to a preset maximum value $e_{cc}^{max}$, and a Young's modulus $E_{cc}$ comprised between a preset minimum value $E_{cc}^{min}$ and a preset maximum value $E_{cc}^{max}$;
  fastening a so-called handle layer to the layer of adhesive, said handle layer having a thickness $e_{cp}$ larger than or equal to a preset minimum value $e_{cp}^{min}$, and a thermal expansion coefficient $\alpha_{cp}$ lower than or equal to the apparent thermal expansion coefficient $\tilde{\alpha}_{P2}$;
  prior to the steps of depositing the adhesive and fastening the handle layer, defining, on the one hand, the maximum value $e_{cc}^{max}$, the minimum value $E_{cc}^{min}$ and the maximum value $E_{cc}^{max}$ for the layer of adhesive, and, on the other hand, the minimum value $e_{cp}^{min}$ for the handle layer, so that, during the hybridization, the interconnection pads of the first chip have, with respect to the interconnection pads of the second chip, a relative misalignment $\Delta L$ smaller than or equal to a preset threshold value $\Delta L^{max}$.

The following are certain preferred but nonlimiting aspects of this method.

The method may comprise a step of defining a maximum value $\tilde{\alpha}_{P1}^{max}$ of the so-called apparent thermal expansion coefficient $\tilde{\alpha}_{P1}$ of the first chip at the first connection face so that the relative misalignment $\Delta L$ is substantially equal to the preset threshold value $\Delta L^{max}$.

The interconnection pads may be distributed periodically with a pitch p, and the preset threshold value $\Delta L^{max}$ may be lower than or equal to p/2.

The layer of adhesive may have a thermal expansion coefficient $\alpha_{cc}$ higher than that $\alpha_{ci}$ of the layer of interest and than that $\alpha_{cp}$ of the handle layer.

The method may comprise a prior step of growing the layer of interest from a growth substrate made of a material having a thermal expansion coefficient higher than the apparent thermal expansion coefficient $\tilde{\alpha}_{P2}$ of the second chip.

The layer of interest of the first chip may comprise light-emitting diodes or photodiodes.

The layer of interest of the first chip may be based on a III-V semiconductor compound or a II-VI semiconductor compound.

The second chip may comprise a so-called carrier layer and an integrated-circuit layer that is located between the second connection face and the carrier layer, the apparent thermal expansion coefficient $\tilde{\alpha}_{P2}$ being substantially equal to the thermal expansion coefficient of the carrier layer.

The carrier layer may be made of silicon.

The layer of adhesive may have a thickness $e_{cc}$ smaller than or equal to 4 times the thickness $e_{ci}$ of the layer of interest.

The layer of adhesive may have a Young's modulus $E_{cc}$ comprised between 90 MPa and 40 GPa.

The thickness $e_{cp}$ of the handle layer may be larger than or equal to 20 times the thickness $e_{ci}$ of the layer of interest.

The invention also relates to a method for hybridizing a first microelectronic chip with a second microelectronic chip having a second face, called the connection face, on which electrical interconnection pads are located, and having a thermal expansion coefficient $\tilde{\alpha}_{P2}$, called the apparent thermal expansion coefficient, the method comprising the following steps:
  providing said second microelectronic chip;
  producing said first microelectronic chip according to any one of the preceding features;
  bringing the first and second chips into contact with each other so that the interconnection pads are aligned and in mutual contact;
  hybridizing the first and second chips with each other, at the temperature value referred to as the hybridization temperature value $T_h$.

BRIEF DESCRIPTION OF THE DRAWINGS

Other aspects, aims, advantages and features of the invention will become more clearly apparent on reading the following detailed description of preferred embodiments thereof, which description is given, by way of nonlimiting example, with reference to the appended drawings, in which.

DETAILED DESCRIPTION OF PARTICULAR EMBODIMENTS

In the figures and in the rest of the description, elements that are identical or similar have been referenced with the same references. In addition, the various elements are not shown to scale to make the figures clearer. Moreover, the various embodiments and variants are not exclusive from one another and may be combined together. Unless otherwise indicated, the terms "substantially", "about" and "of the order of" mean to within 10%.

The invention relates to a method for producing a first microelectronic chip intended to be hybridized with a second microelectronic chip at a hybridization temperature $T_h$ higher than room temperature. By hybridization, what is meant is an assembly of two microelectronic chips so as to mechanically fasten the chips to each other, and to achieve an electrical connection.

The microelectronic chips may comprise integrated circuits and/or optically active elements such as light-emitting diodes or photodiodes. Preferably, the first chip is an optoelectronic chip comprising a matrix array of light-emitting diodes or photodiodes, and the second microelectronic chip comprises an integrated circuit forming a readout circuit intended to apply a control signal or read signal to the light-emitting diodes or to the photodiodes. A chip may be produced from a semiconductor wafer and have dimensions of width, length or diameter, substantially equal to those of the semiconductor wafer. It may also have dimensions smaller than those of the semiconductor wafer.

Each microelectronic chip may comprise one or more layers of various materials each having a specific thermal expansion coefficient. The thermal expansion coefficient of a material expresses the relative elongation $(l_2-l_1)/l_1$ of the material for a given temperature difference $T_2-T_1$. In other words:

$$\alpha=(l_2-l_1)/(l_1 \cdot (T_2-T_1)),$$

where $l_1$ is the length of the material at the temperature $T_1$, and $l_2$ is the length at a temperature $T_2$ higher than $T_1$.

In the case of a chip comprising a plurality of layers of different materials, the apparent thermal expansion coefficient $\tilde{\alpha}$ at a given face of the chip is defined as being the relative elongation $(\tilde{l}_2-\tilde{l}_1)/\tilde{l}_1$ of the chip at the face in question for the given temperature difference $T_2-T_1$. In other words: $\alpha=(\tilde{l}_2-\tilde{l}_1)/(\tilde{l}_1 \cdot (T_2-T_1))$, where $\tilde{l}_1$ and $\tilde{l}_2$ are here lengths measured at the face in question. The apparent thermal expansion coefficient may therefore be measured simply, at the face in question of the chip.

The apparent thermal expansion coefficient of a chip, when the latter is formed from a plurality of layers of different materials, differs from the average thermal expansion coefficient of the chip, which essentially corresponds to a weighting of the thermal expansion coefficients of each layer of the chip depending on their volume fraction, thickness and/or coefficients of elasticity (Young's modulus and Poisson's ratio). Thus, the average thermal expansion coefficient of a layer comprising a plurality of different materials may be expressed as: $<\alpha>=\Sigma_i \alpha_i v_i$, where $\alpha_i$ is the thermal expansion coefficient of the ith material and $v_i$ is the volume fraction of the ith material in the layer. In addition, the average thermal expansion coefficient of a chip comprising a plurality of layers of different materials may be expressed as:

$$<\alpha>=(\Sigma_i \alpha_i e_i E_i/[(1-v_i)\cdot(1-\alpha_i \Delta T)])/(\Sigma_i e_i E_i/[(1-v_i)\cdot(1-\alpha_i \Delta T)]),$$

where $\alpha_i$ is the thermal expansion coefficient of the material of the ith layer, $e_i$ is the thickness of the ith layer, and $E_i$ and $v_i$ are the Young's modulus and the Poisson's ratio of the material of the ith layer.

Moreover, a layer or chip is said to be based on a material when its average thermal expansion coefficient is substantially equal to the thermal expansion coefficient of the material. By way of example, a layer comprising a plurality of light-emitting diodes made of GaN may comprise segments electrically isolating the diodes from one another made of a dielectric, for example an oxide or nitride of silicon. Such a layer is then said to be based on GaN when its average expansion coefficient is substantially equal to that of GaN.

The first and second microelectronic chips each comprise N×M electrical interconnection pads via which the mechanical assembly of and the electrical connection between the chips are intended to be obtained. The values N and M may be identical or different. The N×M interconnection pads are located on a connection face of the chip, and are spaced apart from one another, preferably periodically with a pitch p. The pitch p is here considered to be identical along the axis of the N pads and along the axis of the M pads, but it may be different. They are made from at least one electrically conductive material. The interconnection pads of the first chip and/or of the second chip, here of the second chip, comprise a meltable material the melting point of which is lower than or equal to the hybridization temperature. By way of example, it may be a question of bumps made of indium or SnAgCu (SAC) or of alloys thereof. The assembly of the microelectronic chips then corresponds to a hybridization achieved by melting.

The invention mainly relates to a method for producing a first microelectronic chip so that, during its hybridization with a second microelectronic chip, the interconnection pads have a relative misalignment smaller than or equal to a preset threshold. By relative misalignment, what is meant is the distance, in the plane parallel to the connection faces, between the center, or barycenter, of an interconnection pad of the first chip and the center, or barycenter, of the interconnection pad, of the second chip, with which it was initially aligned.

Figure 2:
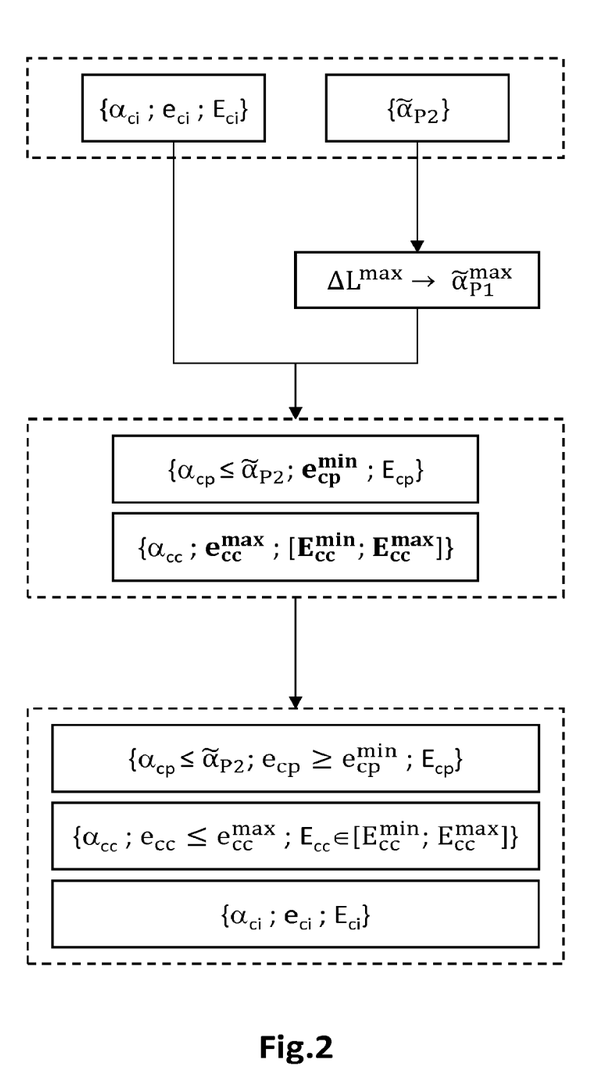
FIG. 2 is a flowchart of a method for producing a first microelectronic chip intended to be hybridized at the hybridization temperature $T_h$ with a second microelectronic chip.

FIG. 2 is a flowchart of a method for producing a first microelectronic chip P1 intended to be hybridized with a second microelectronic chip P2 at a hybridization temperature $T_h$, such as the method described with reference to FIGS. 5A to 5I.

The first chip P1 comprises a layer 13, called the layer of interest, having a thermal expansion coefficient $\alpha_{ci}$, a thickness denoted $e_{ci}$, and a Young's modulus $E_{ci}$. The layer of interest 13 is based on a material of interest, here a crystalline semiconductor material. Thus, the coefficient $\alpha_{ci}$ of the layer of interest 13 is substantially equal to the thermal expansion coefficient of the material of interest. The material of interest may be a III-V semiconductor compound, i.e. a compound containing III elements and elements from elements V of the periodic table, for example GaN, or a II-VI semiconductor compound, or even a IV semiconductor compound such as germanium. It may extend continuously in the plane of the layer and through all or some of the thickness of the layer, or, as a variant, may extend so as to form segments or zones that are separate from one another.

In this example, the first chip P1 is an optoelectronic chip the layer of interest 13 of which comprises a matrix array of light-emitting diodes that are based on GaN (not shown). The light-emitting diodes may have an identical or similar structure to that described in patent application FR3023061, or to that described in the publication by Fan et al entitled *III-nitride micro-emitter arrays development and applications*, J. Phys. D: Appl. Phys. 41 (2008) 094001.

The first chip Pt comprises a so-called connection face 11 at which is located a matrix array of N×M electrical interconnection pads 12. The interconnection pads 12, which are made of a material that is electrically conductive and optionally transparent to the light radiation emitted by the diodes, make electrical contact with the light-emitting diodes. The interconnection pads 12 are spaced apart from one another, preferably periodically with a pitch p.

The second microelectronic chip P2 has a second so-called connection face 21 on which is located a matrix array of N×M electrical interconnection pads 22. The interconnection pads 22 here contain a meltable material that melts at the hybridization temperature $T_h$, and are spaced apart from one another in an identical way to the pads 12 of the chip P1. The chip P2 has a thermal expansion coefficient, called the apparent thermal expansion coefficient, denoted $\tilde{\alpha}_{P2}$, defined at the connection face 21.

The chip P2 comprises a so-called carrier layer 24 having a thickness $e_{cs}$ and made of a material having a thermal expansion coefficient $\alpha_{cs}$. By way of example, the carrier layer 24 may be a substrate, or wafer, of silicon of a thickness of 725 m. The thermal expansion coefficient $\alpha_{cs}$, is then about $2.6 \times 10^{-6}$ K$^{-1}$.

The chip P2 may comprise other layers than the carrier layer 24, notably a layer 23 referred to as the integrated-circuit layer formed from an electrically insulating material, for example a dielectric such as $SiO_2$, in which are found electrical connection lines (not shown) made of an electrically conductive material, for example a metal. This integrated-circuit layer 23 is located between the connection face 21 and the carrier layer 24.

The second chip P2 is based on the material of the carrier layer 24, so that it has an apparent thermal expansion coefficient $\tilde{\alpha}_{P2}$, at the connection face 21, substantially equal to the thermal expansion coefficient $\alpha_{cs}$ of the carrier layer 24, in other words: $\tilde{\alpha}_{P2} \sim \alpha_{cs}$.

However, the apparent thermal expansion coefficient $\tilde{\alpha}_{P2}$ of the chip P2 is lower than the thermal expansion coefficient $\alpha_{ci}$ of the layer of interest 13 of the chip P1. By way of example, the coefficient $\alpha_{ci}$ is about $5.6 \times 10^{-6}$ K$^{-1}$ for a layer of interest 13 based on GaN and the apparent coefficient $\tilde{\alpha}_{P2}$ is about $2.6 \times 10^{-6}$ K$^{-1}$ for a chip P2 based on silicon. According to the invention, it is sought to mechanically constrain the layer of interest 13 of the chip P1 in order to control and limit the relative misalignment $\Delta L$ of the interconnection pads 12 with respect to those 22 of the chip P2.

To do this, a first step consists in considering, on the one hand, the thermomechanical properties of the layer of interest 13 of the chip P1 and, on the other hand, the thermomechanical properties of the second chip P2. Thus an input dataset is obtained, namely:

for the layer of interest 13 of the chip P1: the thermal expansion coefficient $\alpha_{ci}$, the thickness $e_{ci}$, and the Young's modulus $E_{ci}$;

for the chip P2: the apparent thermal expansion coefficient $\tilde{\alpha}_{P2}$ at the connection face 21.

A second step consists in determining a maximum threshold value $\Delta L^{max}$ for the relative misalignment $\Delta L$ between the interconnection pads 12 of the chip P1 and the interconnection pads 22 of the chip P2, so as to limit or even avoid the risk of loss of mechanical and therefore electrical contact between the interconnection pads.

This maximum threshold value $\Delta L^{max}$ notably depends on the spacing between adjacent interconnection pads 12, 22 of a given connection face 11, 21. Thus, in the case where the N*M interconnection pads are spaced apart from one another periodically with a pitch p, the maximum threshold value $\Delta L^{max}$ of the relative misalignment $\Delta L$ may be lower than or equal to p/2, and preferably be lower than or equal to p/4. The pads may have an average dimension, in the XY plane, substantially equal to p/2. Preferably, the maximum threshold value $\Delta L^{max}$ of the relative misalignment $\Delta L$ may be lower than or equal to the average dimension of the pads, for example equal to p/2, and preferably be lower than or equal to half the average dimension of the pads, for example equal to p/4. By average dimension of a pad, what is meant is the dimension of width or of length of the pad, or even of diameter, along an axis passing through the N or M interconnection pads.

Advantageously, the maximum threshold value $\Delta L^{max}$ may be expressed in terms of the apparent thermal expansion coefficient $\tilde{\alpha}_{P1}$ of the chip P1 at its connection face 11. Thus, the maximum threshold value $\Delta L^{max}$ of the relative misalignment is reached, for a maximum value $\tilde{\alpha}_{P1}^{max}$ of the apparent expansion coefficient $\tilde{\alpha}_{P1}$ of the chip P1 at its connection face 11, using the relationship: $\tilde{\alpha}_{P1}^{max} \sim 2 \cdot \Delta L^{max}/(L \cdot \Delta T) + \tilde{\alpha}_{P2}$. For example, in the case of an N×N matrix array of interconnection pads spaced apart periodically by a pitch p, and for a maximum relative misalignment $\Delta L^{max}$ substantially equal to p/2, the length L being able to be estimated to be N·p, a maximum value $\tilde{\alpha}_{P1}^{max}$ substantially equal to $1/(N \cdot \Delta T) + \tilde{\alpha}_{P2}$ is obtained.

Thus, for a matrix array of N×N interconnection pads to be hybridized and a given temperature increase $\Delta T$, the maximum value $\tilde{\alpha}_{P1}^{max}$ of the apparent thermal expansion coefficient of the chip P1 at the connection face 11 is determined.

Figure 3:
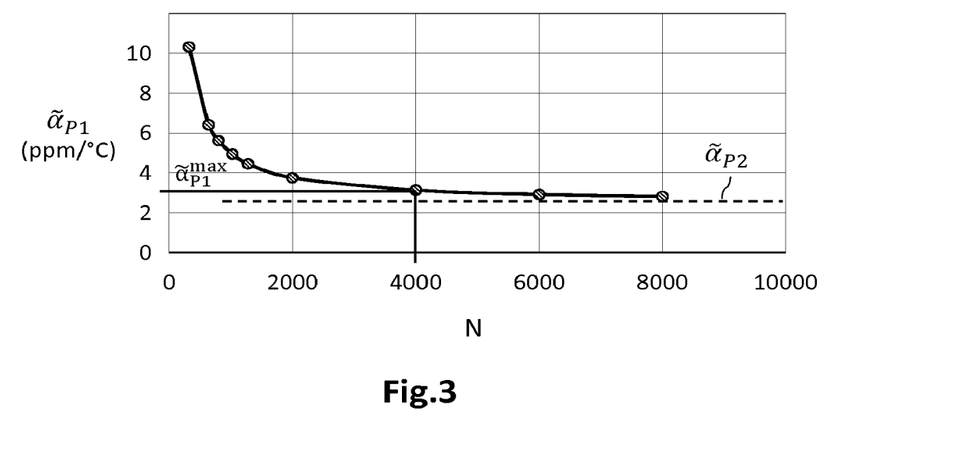
FIG. 3 illustrates an example of the variation in the value of the apparent thermal expansion coefficient $\tilde{\alpha}_{P1}$ of the first chip at its connection face as a function of the number N×N of interconnection pads.

FIG. 3 illustrates an example of the relationship between the apparent thermal expansion coefficient $\tilde{\alpha}_{P1}$ of the chip P1 at its connection face 11 as a function of the number N×N of interconnection pads, for a maximum threshold value $\Delta L^{max}$ substantially equal to p/4, and for a temperature difference $\Delta T$ of about 200° C. The dashed line represents the apparent thermal expansion coefficient $\tilde{\alpha}_{P2}$ of the chip P2, here substantially equal to $2.6 \times 10^{-6}$ K$^{-1}$ for a chip P2 based on silicon.

Thus, if it is desired to be able to hybridize chips P1 and P2 having a matrix array of N×N=4000×4000 interconnection pads, the maximum value $\tilde{\alpha}_{P1}^{max}$ is about $3 \times 10^{-6}$ K$^{-1}$.

A third step consists in determining threshold values for thermomechanical and dimensional characteristics of the chip P1, the latter then being formed from the layer of interest 13 to which is fastened a layer 15, called the handle layer, by means of an intermediate layer of adhesive 14, in such a way that, during the hybridization of the chips P1 and P2, the relative misalignment $\Delta L$ is substantially equal to the maximum threshold value $\Delta L^{max}$. This is achieved when the apparent expansion coefficient $\tilde{\alpha}_{P1}$ of the chip P1 is substantially equal to the maximum value $\tilde{\alpha}_{P1}^{max}$.

The handle layer 15 is based on a material that is preferably identical to the material of the carrier layer 24 of the chip P2, and hence:

its thermal expansion coefficient $\alpha_{cp}$ is lower than or substantially equal to, and preferably substantially equal to, the apparent thermal expansion coefficient $\tilde{\alpha}_{P2}$ of the chip P2;

its thickness $e_{cp}$ has a minimum threshold value $e_{cp}^{min}$ to be determined;

advantageously, its Young's modulus $E_{cp}$ and its Poisson's ratio $\nu_{cp}$ are substantially equal to those of the carrier layer 24 of the chip P2.

The layer of adhesive 14 has the following characteristics:

its thickness e has a maximum threshold value $e_{cc}^{max}$ to be determined;

its Young's modulus $E_{cc}$, at room temperature, is comprised between a minimum threshold value $E_{cc}^{min}$ and a maximum threshold value $E_{cc}^{max}$ to be determined;

the thermal expansion coefficient $\alpha_{cc}$ has a value that may be higher, by at least 10 times or even 20 times, than that of the layer of interest 13 and of the handle layer 15.

The minimum thickness $e_{cp}^{min}$ of the handle layer 15, on the one hand, and the maximum value $e_{cc}^{max}$, the minimum value $E_{cc}^{min}$ and the maximum value $E_{cc}^{max}$ of the layer of adhesive 14, on the other hand, may be determined via a parametric study carried out by numerical simulation, in particular by means of the software package ANSYS®, of the thermomechanical behavior of the chip P1 modelled using a finite element method.

In this example, the variables that are the thickness $e_{cp}$ of the handle layer 15, and the thickness $e_{cc}$ and the Young's modulus $E_{cc}$ of the layer of adhesive 14, are varied so that the apparent expansion coefficient $\tilde{\alpha}_{P1}$ of the chip P1 at its connection face 11 has a value equal to the maximum value $\tilde{\alpha}_{P1}^{max}$.

Figure 4A:
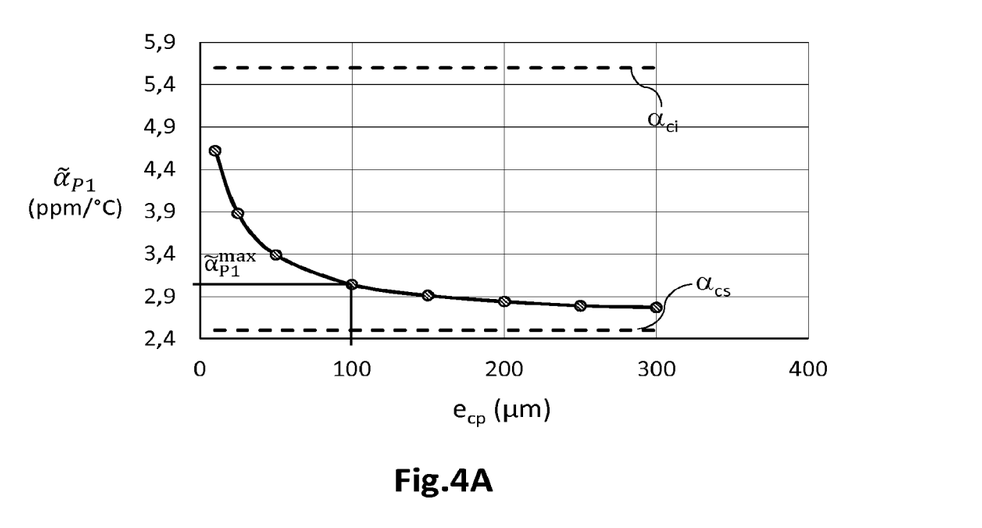
FIGS. 4A to 4C illustrate examples of the variation in the apparent thermal expansion coefficient $\tilde{\alpha}_{P1}$ of the first chip at its connection face as a function of the thickness $e_{cs}$ of the carrier layer (FIG. 4A), of the thickness $e_{cc}$ of the layer of adhesive (FIG. 4B), and of the Young's modulus $E_{cc}$ of the layer of adhesive (FIG. 4C)
Figure 4B:
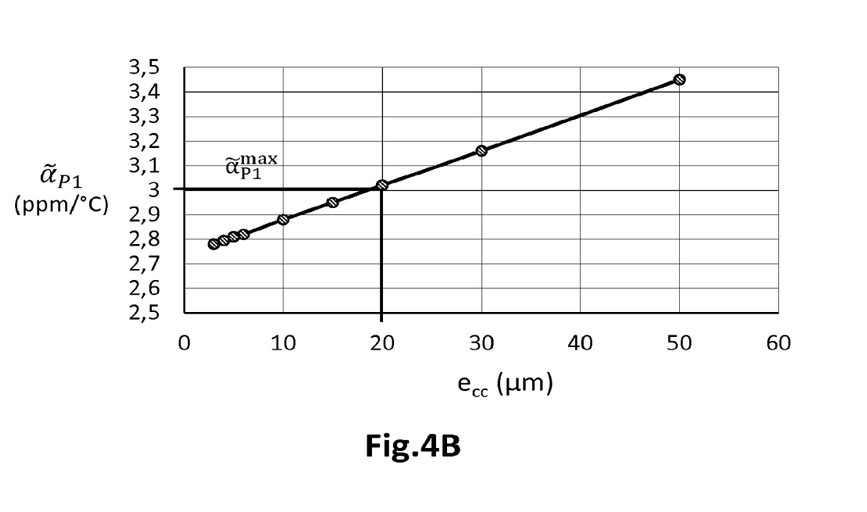
Figure 4C:
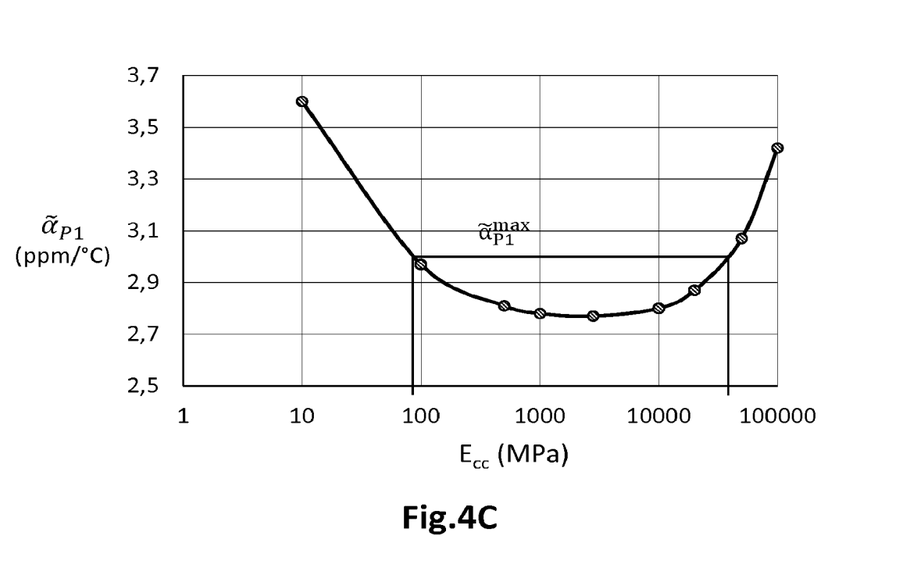

FIGS. 4A to 4C are examples illustrating the influence of said variables on the apparent expansion coefficient $\tilde{\alpha}_{P1}$ of the chip P1. In these examples, the chip P2 is based on silicon, and has an apparent thermal expansion coefficient $\tilde{\alpha}_{P2}$ of $2.6 \times 10^{-6}$ K$^{-1}$.

The chip P1 comprises a layer of interest 13 based on GaN, and has a thermal expansion coefficient $\alpha_{ci}$ equal to about $5.6 \times 10^{-6}$ K$^{-1}$, a thickness $e_{ci}$ of about 5 µm, a Young's modulus $E_{ci}$ equal to about 390 GPa and a Poisson's ratio $\nu_{ci}$ equal to about 0.33. The layer of adhesive 14 has a thermal expansion coefficient $\alpha_{cc}$ equal to about $86 \times 10^{-6}$ K$^{-1}$, a thickness $e_{cc}$ the maximum value of which is to be determined, a Young's modulus $E_{cc}$ the minimum and maximum values of which are to be determined, and a Poisson's ratio of about 0.35, here in the case of an epoxy adhesive, for example the adhesive EPO-TEK E360. The handle layer 15 is based on silicon. It has a thermal expansion coefficient $\alpha_{cp}$ equal to about $2.6 \times 10^{-6}$ K$^{-1}$, a thickness $e_{cp}$ the minimum value of which is to be determined, a Young's modulus $E_{cp}$ equal to about 130 GPa, and a Poisson's ratio of about 0.28.

As illustrated in FIG. 3, the hybridization of a chip P1 with a chip P2 via 4000×4000 interconnection pads at a hybridization temperature of 200° C., i.e. a $\Delta T$ of about 200° C., with a relative misalignment smaller than or equal to the pitch p/4, requires the chip P1 to have an apparent expansion coefficient $\tilde{\alpha}_{P1}$ lower than or equal to a maximum value $\tilde{\alpha}_{P1}^{max}$ equal to about $3 \times 10^{-6}$ K$^{-1}$.

FIG. 4A illustrates the influence of the thickness $e_{cp}$ of the handle layer 15 on the value of the apparent expansion coefficient $\tilde{\alpha}_{P1}$ of the chip P1 at the connection face 11, in the case where the layer of adhesive 14 has a thickness of 2.5 µm and a Young's modulus of 2.8 GPa at room temperature. The maximum value $\tilde{\alpha}_{P1}{}^{max}$ of $3\times10^{-6}$ K$^{-1}$ for the apparent thermal expansion coefficient $\tilde{\alpha}_{P1}$ of the chip P1 is achieved with a minimum value $e_{cp}{}^{min}$ of the handle layer 15 of about 100 µm. In the case where the handle layer 15 has a value higher than or equal to this minimum value, the relative misalignment $\Delta L$ will be smaller than or equal to the preset threshold value, namely here P/4.

FIG. 4B illustrates the influence of the thickness $e_{cc}$ of the layer of adhesive 14 on the value of the apparent expansion coefficient $\tilde{\alpha}_{P1}$ of the chip P1 at the face 11, in the case where the handle layer 15 has a thickness of 300 µm and where the layer of adhesive 14 has a Young's modulus of 2.8 GPa. The maximum value $\tilde{\alpha}_{P1}{}^{max}$ of $3\times10^{-6}$ K$^{-1}$ for the apparent thermal expansion coefficient $\tilde{\alpha}_{P1}$ of the chip P1 is achieved with a maximum value $e_{cc}{}^{max}$ of the layer of adhesive 14 of about 18 µm. In the case where the layer of adhesive 14 has a value lower than or equal to this maximum value, the relative misalignment $\Delta L$ will be smaller than or equal to the preset threshold value, namely here p/4.

FIG. 4C illustrates the influence of the Young's modulus $E_{cc}$ of the layer of adhesive 14 on the value of the apparent expansion coefficient $\tilde{\alpha}_{P1}$ of the chip P1 at the face 11. In this example, the handle layer 15 has a thickness of about 300 µm and the layer of adhesive 14 has a thickness of about 2.5 µm.

The inventors have demonstrated that, generally, the value of the apparent thermal expansion coefficient $\tilde{\alpha}_{P1}$ of the chip P1 at the connection face 11 is lower than or equal to the maximum value $\tilde{\alpha}_{P1}{}^{max}$ when the value of the Young's modulus $E_{cc}$ of the layer of adhesive 14 belongs to an interval bounded by a minimum value $E_{cc}{}^{min}$ and a maximum value $E_{cc}{}^{max}$, the limits being included.

Specifically, it would appear that, when the Young's modulus $E_{cc}$ has a value lower than the minimum value $E_{cc}{}^{min}$, the apparent thermal expansion coefficient $\tilde{\alpha}_{P1}$ is higher than the maximum value $\tilde{\alpha}_{P1}{}^{max}$. Specifically, there is then a mechanical decoupling, in terms of transmission of mechanical stresses, between the layer of interest 13 of high thermal expansion coefficient and the handle layer 15 of low thermal expansion coefficient. In other words, during the application of the hybridization temperature $T_h$, there is a lack of transmission of mechanical stresses between the handle layer 15 and the layer of interest 13 at the layer of adhesive 14, so that the layer of interest 13 is then not or hardly stressed by the handle layer 15.

It would furthermore appear that, when the Young's modulus has a value higher than the maximum value $E_{cc}{}^{max}$, the apparent thermal expansion coefficient $\tilde{\alpha}_{P1}$ also becomes higher than the maximum value $\tilde{\alpha}_{P1}{}^{max}$. In this case, there is also a decoupling of mechanical stresses between the handle layer 15 and the layer of interest 13. However, on application of the hybridization temperature $T_h$, the layer of interest 13 is essentially coupled to the layer of adhesive 14, which has a very high thermal expansion coefficient, and not to the handle layer 15.

It would therefore appear that a satisfactory coupling of mechanical stresses between the handle layer 15 and the layer of interest 13 is possible when the value of the Young's modulus $E_{cc}$ of the adhesive is comprised between the minimum value $E_{cc}{}^{min}$ and the maximum value $E_{cc}{}^{max}$. This is particularly surprising in so far as the adhesive has a high thermal expansion coefficient, here $85\times10^{-6}$ K$^{-1}$, much higher than that of the handle layer 15 and than that of the layer of interest 13. Now, document WO 2013/068891 teaches that an adhesive of high thermal expansion coefficient prevents satisfactory transmission of mechanical stresses between two substrates. Those skilled in the art would therefore have considered that adhesively bonding the layer of interest 13 to a handle layer 15 of low thermal expansion coefficient would not have allowed the maximum value $\tilde{\alpha}_{P1}{}^{max}$ of the apparent thermal expansion coefficient $\tilde{\alpha}_{P1}$ to be reached in so far as the thermal expansion coefficients of adhesives generally have very high values.

A fourth step consists in depositing the layer of adhesive 14 on the face 13a of the layer of interest 13 opposite to the connection face 11, then in fastening the handle layer 15 to the layer of adhesive 14.

The layer of adhesive 14 is chosen so that, on the one hand, its thickness $e_{cc}$ is smaller than or equal to the maximum value $e_{cc}{}^{max}$ determined beforehand, and, on the other hand, so that its Young's modulus $E_{cc}$ is comprised between the minimum value $E_{cc}{}^{min}$ and maximum value $E_{cc}{}^{max}$ determined beforehand.

The handle layer 15 is chosen so that, on the one hand, its thickness $e_{cp}$ is larger than or equal to the minimum value $e_{cp}{}^{min}$ determined beforehand, and, on the other hand, so that its thermal expansion coefficient $\alpha_{cp}$ is lower than or equal to the apparent coefficient $\tilde{\alpha}_{P2}$ of the chip P2.

The layer of adhesive 14 may have a thermal expansion coefficient $\alpha_{cc}$ higher than the coefficient $\alpha_{ci}$ of the layer of interest 13 and than the coefficient $\alpha_{cp}$ of the handle layer 15. As mentioned above, the inventors have demonstrated the satisfactory transmission of mechanical stresses between the handle layer 15 and the layer of interest 13 during the hybridization at the temperature $T_h$, thus allowing the expansion of the layer of interest 13 to be limited with the aim of controlling the relative misalignment between the interconnection pads.

Generally, but in particular in the case of a chip P1, comprising a layer of interest 13 based on GaN adhesively bonded to a handle layer 15 made of silicon, hybridized with a chip P2 based on silicon, it is advantageous for the layer of adhesive 14 to have a thickness $e_{cc}$ smaller than or equal to 4 times the thickness $e_{ci}$ of the layer of interest 13, and preferably smaller than or equal to 2 times this thickness $e_{ci}$. It is also advantageous for the layer of adhesive 14 to have a Young's modulus $E_{cc}$ comprised between 90 MPa and 40 GPa. In addition, it is advantageous for the thickness $e_{cp}$ of the handle layer 15 to be at least 20 times larger than the thickness $e_{ci}$ of the layer of interest 13. A relative misalignment smaller than or equal to p/2 is then obtained between the chips P1 and P2 each of which has N×M interconnection pads, the highest of N and M being lower than or equal to about 4000.

FIGS. 5A to 5I are schematic partial cross-sectional views of an example of a method for hybridizing a first microelectronic chip P1 with a second microelectronic chip P2, comprising steps of preparing and producing the first chip P1.

Here and for the rest of the description a direct three-dimensional coordinate system (X, Y, Z) is defined where the X and Y axes form a plane parallel to the main plane of the layer of interest 13, and where the Z axis is oriented substantially orthogonally to the main plane of the layer of interest 13. In the rest of the description, the terms "vertical" and "vertically" are understood to be relative to an orientation substantially parallel to the Z axis, and the terms "horizontal" and "horizontally" as being relative to an orientation substantially parallel to the (X, Y) plane.

Figure 5A:
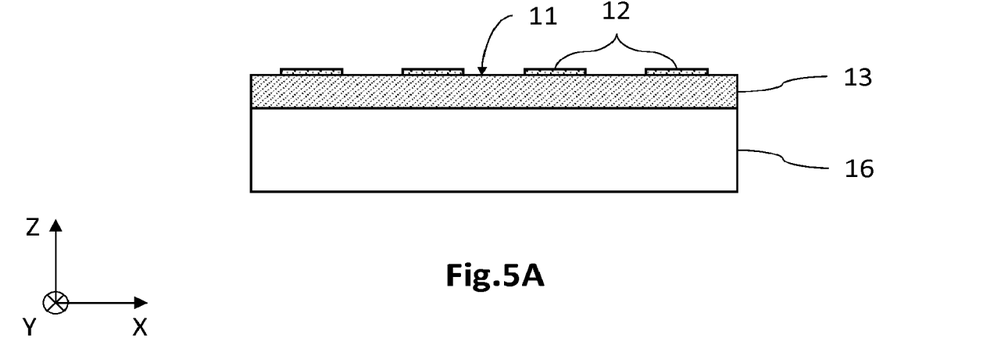
FIGS. 5A to 5I are schematic partial cross-sectional views of various steps: a step of preparing a layer of interest, a step of producing a first microelectronic chip comprising the layer of interest according to the method illustrated in FIG. 2, then a step of hybridizing the first microelectronic chip with a second microelectronic chip.

With reference to FIG. 5A, the layer of interest 13 is grown from a growth substrate 16. The growth may be carried out epitaxially, for example by metal organic chemical vapor deposition (MOCVD). The growth substrate 16 may have a thermal expansion coefficient higher than that of the layer of interest 13. In the case of a layer of interest 13 based on GaN of a thickness of 5 µm, the growth substrate 16 may be sapphire (Al$_2$O$_3$), the thermal expansion coefficient of which is equal to about 7.5×10$^{-6}$ K$^{-1}$.

Here a matrix array (not shown) of light-emitting diodes is produced, for example using the method described in patent application FR3023061. Next, the N×N or N×M interconnection pads 12 are produced on the connection face 11 of the layer of interest 13. The interconnection pads 12 are here segments of an electrically conductive and transparent material, such as ITO, that are electrically connected to the light-emitting diodes.

Figure 5B:
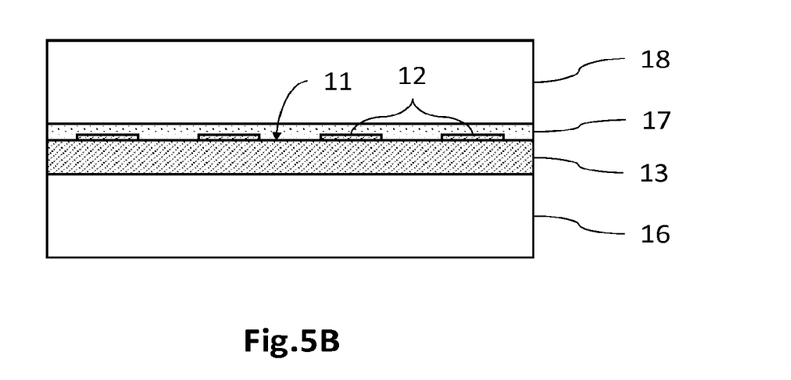
Figure 5C:
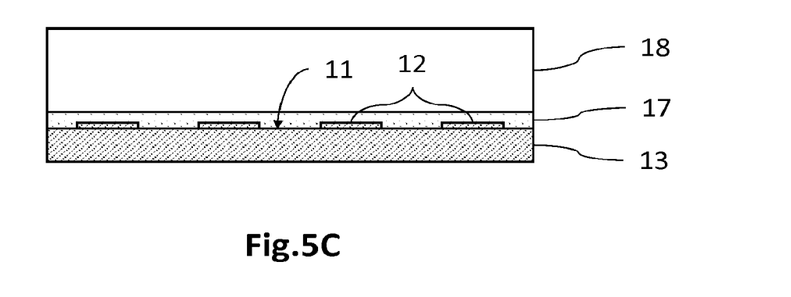
Figure 5D:
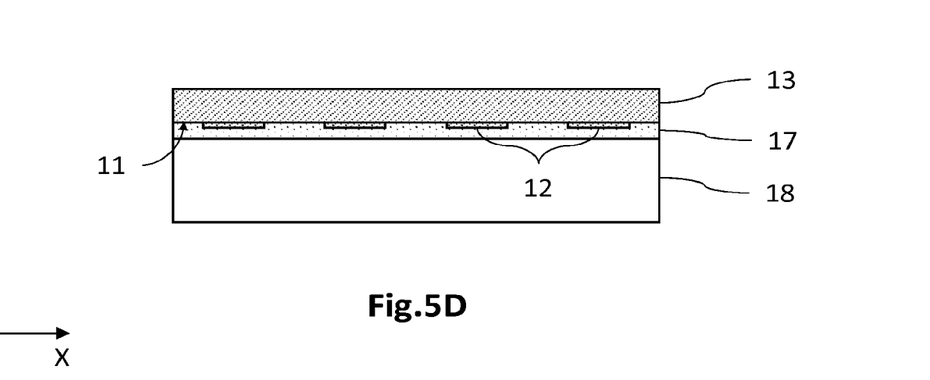

A temporary layer of adhesive 17, for example of an epoxy adhesive, is deposited so as to cover the connection face 11 of the layer of interest 13, then a temporary handle layer 18, for example a substrate or wafer, of silicon or of a material the thermal expansion coefficient of which is close to that of Si, is affixed (FIG. 5B). Next, the growth substrate 16 is removed, for example by laser (LLO, for laser lift-off) or by grinding and chemical-mechanical polishing (CMP) (FIG. 5C). The stack thus obtained is then flipped (FIG. 5D).

Figure 5E:
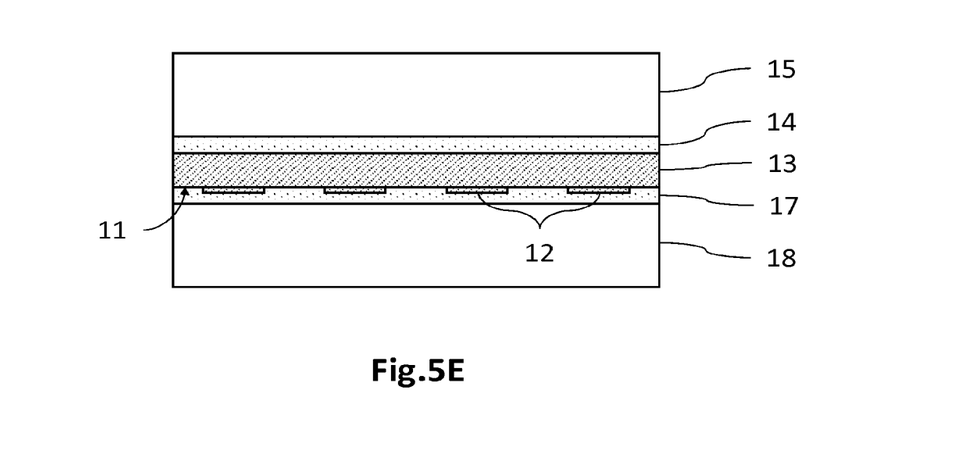

With reference to FIG. 5E, the method for producing the first chip P1 according to the example described above with reference to FIG. 2 is implemented. The layer of adhesive 14 may be an epoxy layer of a thickness of about 2.5 µm and of a Young's modulus of 2.8 GPa. The handle layer 15 is made of silicon and has a thickness of 300 µm, or even of 725 µm in the case of a silicon wafer.

Figure 5F:
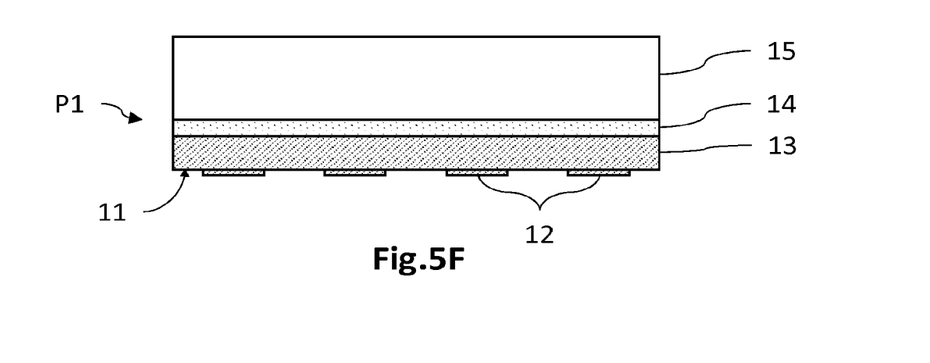

Next, the layer of adhesive 17 and the temporary handle layer 18 are removed so as to free, i.e. to uncover, the connection face 11 of the chip P1 and the interconnection pads 12 (FIG. 5F).

Figure 5G:
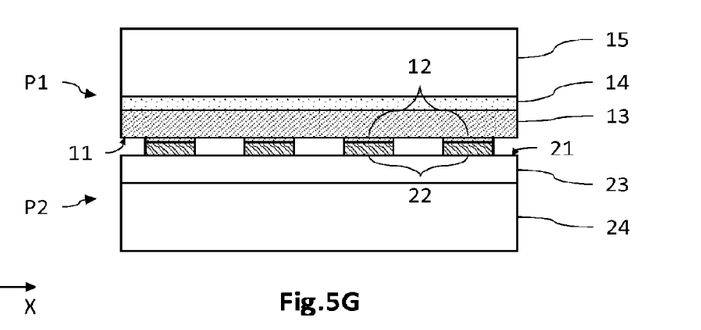

With reference to FIG. 5G, the two chips P1 and P2 are then brought into contact so that the interconnection pads 12, 22 of each chip are pairwise aligned, superposed and in mutual contact. The chip P2 is based on silicon. It comprises an integrated-circuit layer 23 that extends to at its connection face 21 and that forms a readout circuit, which layer rests on a carrier layer 24 made of silicon of a thickness here of 725 µm. It furthermore comprises interconnection pads 22 in particular formed from a meltable material that melts at the hybridization temperature $T_h$. Next, a temperature increase, from room temperature $T_a$ to the hybridization temperature $T_h$, is applied. Thus, the fusion of the interconnection pads 22 of the chip P2 is achieved. The hybridization of the two chips P1, P2 at the interconnection pads 12, 22 is then obtained during the cooling of the chips.

Figure 5H:
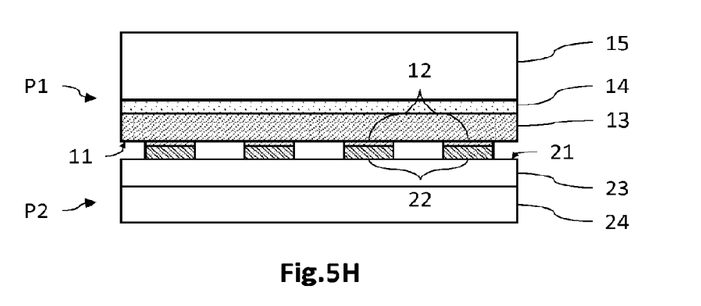

It is then possible to thin the carrier layer 24 of the chip P2 (FIG. 5H). Removal of the carrier layer 24 may be envisioned if the integrated-circuit layer 23 associated with the chip P1 is thick enough to ensure a stack of satisfactory mechanical strength. This thinning may facilitate the dissipation of heat.

Figure 5I:
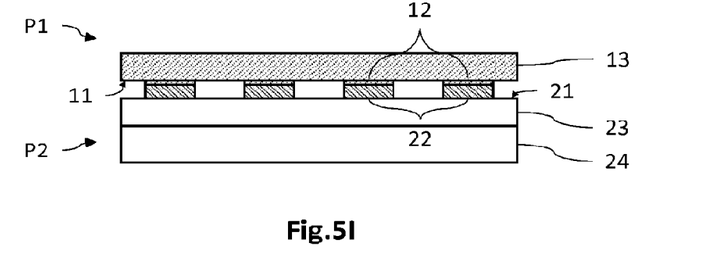

It is also possible to remove the handle layer 15 and the layer of adhesive 14 of the chip P1 (FIG. 5I). Thus a stack of an optoelectronic chip P1 and of an electronic chip P2 comprising a readout circuit is obtained, the relative misalignment ΔL between the interconnection pads 12, 22 of this stack being smaller than or equal to a preset threshold ΔL$^{max}$, thus limiting mechanical and therefore electrical contact faults. In addition, in this example, the stack has a relatively small overall thickness, this allowing the evacuation of the heat produced by the optoelectronic chip to be improved.

Particular embodiments have just been described. Various variants and modifications will appear obvious to those skilled in the art.

The invention claimed is:

1. A method for producing a first microelectronic chip comprising a layer of interest, having a first connection face, on which electrical interconnection pads are located, and having a thermal expansion coefficient $\alpha_{ci}$, the first microelectronic chip to be joined, at a later hybridization step at a hybridization temperature $T_h$, to a second microelectronic chip having a second connection face on which electrical interconnection pads are located, and having an apparent thermal expansion coefficient $\tilde{\alpha}_{P2}$ at the second connection face, lower than the thermal expansion coefficient $\alpha_{ci}$;

the method comprising:
(i) depositing a layer of adhesive on a face of the layer of interest opposite to the first connection face, said layer of adhesive having a thickness $e_{cc}$ smaller than or equal to a maximum value $e_{cc}^{max}$, and a Young's modulus $E_{cc}$, comprised between a minimum value $E_{cc}^{max}$ and a maximum value $E_{cc}^{max}$;
(ii) fastening a handle layer to the layer of adhesive, said handle layer having a thickness $e_{cp}$ larger than or equal to a minimum value $e_{cp}^{min}$, and a thermal expansion coefficient $\alpha_{cp}$ lower than or equal to the apparent thermal expansion coefficient $\tilde{\alpha}_{P2}$;
(iii) prior to the steps of depositing the adhesive and fastening the handle layer, defining the maximum value $e_{cc}^{max}$, the minimum value $E_{cc}^{min}$ and the maximum value $E_{cc}^{max}$ of the layer of adhesive, and the minimum value $e_{cp}^{min}$ of the handle layer, so that, during the hybridization at the hybridization temperature $T_h$, the interconnection pads of the first microelectronic chip have, with respect to the interconnection pads of the second microelectronic chip, a relative misalignment ΔL smaller than or equal to a preset threshold value ΔL$^{max}$.

2. The method as claimed in claim 1, comprising defining a maximum value $\tilde{\alpha}_{P1}^{max}$ of the apparent thermal expansion coefficient $\tilde{\alpha}_{P1}$ of the first microelectronic chip at the first connection face so that the relative misalignment ΔL is substantially equal to the preset threshold value ΔL$^{max}$.

3. The method as claimed in claim 2, wherein the interconnection pads are distributed periodically with a pitch p, and wherein the preset threshold value ΔL$^{max}$ is lower than or equal to p/2.

4. The method as claimed in claim 1, wherein the layer of adhesive has a thermal expansion coefficient $\alpha_{cc}$ higher than $\alpha_{ci}$ of the layer of interest and higher than $\alpha_{cp}$ of the handle layer.

5. The method as claimed in claim 1, comprising growing the layer of interest from a growth substrate made of a material having a thermal expansion coefficient higher than the apparent thermal expansion coefficient $\tilde{\alpha}_{P2}$ of the second microelectronic chip.

6. The method as claimed in claim 1, wherein the layer of interest of the first microelectronic chip comprises light-emitting diodes or photodiodes.

7. The method as claimed in claim 1, wherein the layer of interest of the first microelectronic chip is based on a III-V semiconductor compound or a II-VI semiconductor compound.

8. The method as claimed in claim 1, wherein the second microelectronic chip comprises a carrier layer and an integrated-circuit layer that is located between the second connection face and the carrier layer, the apparent thermal expansion coefficient $\tilde{\alpha}_{P2}$ being substantially equal to the thermal expansion coefficient of the carrier layer.

9. The method as claimed in claim 8, wherein the carrier layer is made of silicon.

10. The method as claimed in claim 1, wherein the layer of adhesive has the thickness $e_{cc}$ smaller than or equal to 4 times a thickness $e_{ci}$ of the layer of interest.

11. The method as claimed in claim 1, wherein the layer of adhesive has the Young's modulus $E_{cc}$ comprised between 90 MPa and 40 GPa.

12. The method as claimed in claim 1, wherein the thickness $e_{cp}$ of the handle layer is larger than or equal to 20 times a thickness $e_{ci}$ of the layer of interest.

13. A method for hybridizing a first microelectronic chip with a second microelectronic chip having a second connection face, on which electrical interconnection pads are located, and having an apparent thermal expansion coefficient $\alpha_{P2}$, the method comprising:
  providing said second microelectronic chip;
  producing said first microelectronic chip as claimed in claim 1;
  bringing the first and second microelectronic chips into contact with each other so that the interconnection pads are aligned and in mutual contact;
  hybridizing the first and second microelectronic chips with each other, at the hybridization temperature value $T_h$.

14. The method as claimed in claim 13, further comprising removing the layer of adhesive and the handle layer after the hybridizing.

* * * * *

UNITED STATES PATENT AND TRADEMARK OFFICE
CERTIFICATE OF CORRECTION

PATENT NO. : 11,165,005 B2  
APPLICATION NO. : 16/342446  
DATED : November 2, 2021  
INVENTOR(S) : Gasse et al.

Page 1 of 1

It is certified that error appears in the above-identified patent and that said Letters Patent is hereby corrected as shown below:

In the Claims

In Column 12, Claim 1, Line 21, delete "$E_{cc}$," and insert -- $E_{cc}$ --, and, In Column 12, Claim 1, Line 21, delete "$E_{cc}^{max}$" and insert -- $E_{cc}^{min}$ --.

Signed and Sealed this  
Thirty-first Day of May, 2022

*Katherine Kelly Vidal*

Katherine Kelly Vidal  
*Director of the United States Patent and Trademark Office*